United States Patent [19]

Inoue et al.

[11] 4,046,607

[45] Sept. 6, 1977

[54] METHOD OF MANUFACTURING A SEMICONDUCTOR DEVICE

[75] Inventors: Yasukazu Inoue; Shoji Fujimoto, both of Tokyo, Japan

[73] Assignee: Nippon Electric Co., Ltd., Tokyo, Japan

[21] Appl. No.: 694,359

[22] Filed: June 9, 1976

[30] Foreign Application Priority Data

June 13, 1975 Japan .................................. 50-71770

[51] Int. Cl.$^2$ .......................................... H01L 21/225
[52] U.S. Cl. .................................... 148/187; 148/188
[58] Field of Search ............... 148/174, 175, 186, 187, 148/188

[56] References Cited

U.S. PATENT DOCUMENTS 3,806,361  4/1974  Lehner ................................ 148/174

3,847,687  11/1974  Davidsohn .......................... 148/187

*Primary Examiner*—G. Ozaki
*Attorney, Agent, or Firm*—Hopgood, Calimafde, Kalil, Blaustein & Lieberman

[57] ABSTRACT

A silicon layer is deposited over the insulating layer covering the surface of the semiconductor substrate and apertured to define a contact window through which the silicon layer is connected with a one-conductivity-type region formed in the semiconductor substrate. An impurity of the one conductivity type is introduced into the one-conductivity-type region through the contact window from the silicon layer. This impurity may be supplied from the surface of the silicon layer or may be preliminarily doped in the silicon layer. A conductive layer is deposited over the silicon layer and is formed to a predetermined pattern. Thereafter, the silicon layer is formed to the same pattern.

13 Claims, 22 Drawing Figures

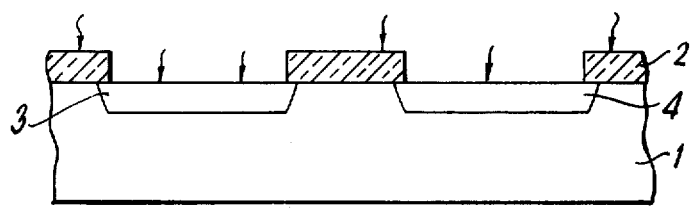
FIG. IA
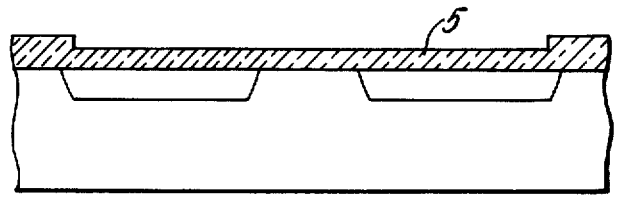
FIG. IB
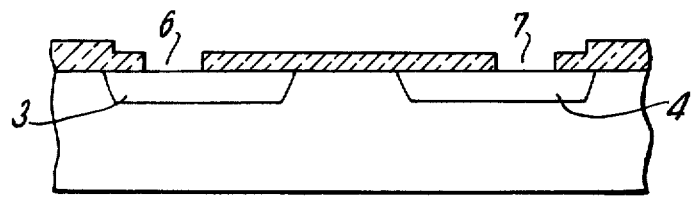
FIG. IC
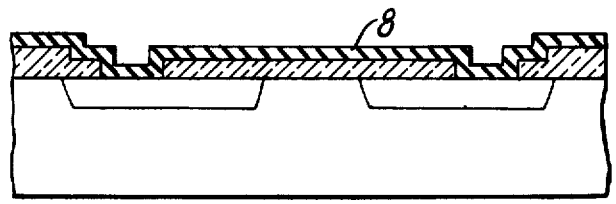
FIG. ID
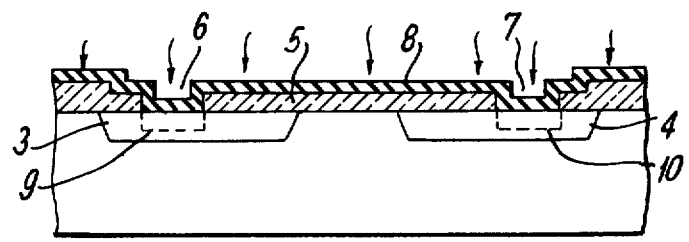
FIG. IE

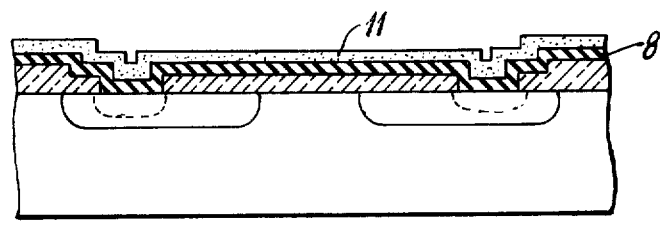
FIG. IF
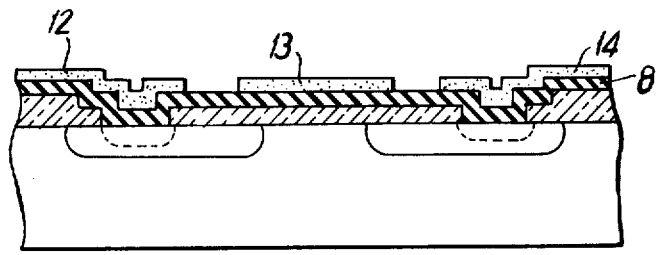
FIG. IG
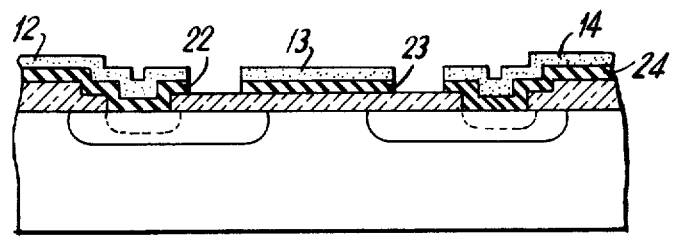
FIG. IH
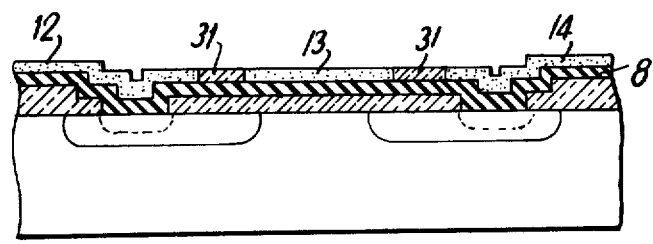
FIG. II
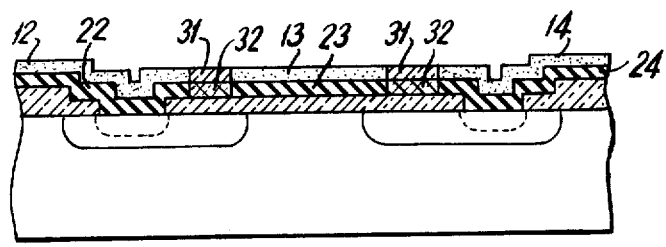
FIG. IJ

METHOD OF MANUFACTURING A SEMICONDUCTOR DEVICE

BACKGROUND OF THE INVENTION

This invention relates to an improved process of forming conductive layers in semiconductor device fabrication.

Formation of the conductive layers such as electrodes and interconnection layers in integrated circuit semiconductor devices is one of the main and important processes in semiconductor device fabrication. Such conductive layers have usually been formed of aluminum, of the purity of the order of 99%, as aluminum excels most of other conductor metals in ease of deposition and etching and thus is conveniently usable on a semiconductor device as a material for conductive layers. The use of high purity aluminum, however, has involved some serious difficulties with semiconductor devices having a silicon substrate. As is well known, the substrate is heat-treated after formation thereon of a conductive layer of aluminum in order to form ohmic contacts between the contact regions of the silicon substrate and aluminum and, in this process, there arises in the contact regions a phenomenon that part of the substrate silicon diffuses into the aluminum layer. As a consequence, small pits are left in the surface of the contact regions and aluminum enters into these pits from the conductive layer as a substitute for the silicon dissolving or diffusing into the conductive layer. In cases where the device is of the planar structure having a p-n junction formed at a relatively shallow level, the pits may reach the junction level, involving the danger that the withstand voltage of the p-n junction will be deteriorated and the reverse leak current thereof increased.

Further, in the prior art, connection of the conductive layer to the contact region of the substrate has another problem, where the contact region is surrounded by the opposite conductivity type. In detail, a semiconductor region of one conductivity type is formed in the semiconductor substrate of the opposite conductivity type or in another region of the opposite conductivity type formed in or on the semiconductor substrate of one conductivity type, and then is covered with an oxide film. Thereafter, a contact window is formed in the oxide film and a conductive layer is deposited to make direct contact with the one conductivity type region through the contact window. In this process, two separate photoresist steps are required; one for defining the position of the one conductivity type region and the other for defining the position of the contact window. Since these two steps are performed separately, there is involved the danger that the contact window be placed out of registry with the one conductivity type region, partly extending beyond the latter, with the result that the conductive layer to be contacted with the contact region through the contact window causes short-circuiting between the one conductivity type region and the adjacent opposite conductivity type region. In order to avoid such danger, it has been usual to provide the one conductivity type region with an appropriate allowance for alignment with the contact window, which causes an undesirable increase in the size of the one conductivity type region and hence in the size of the semiconductor device.

SUMMARY OF THE INVENTION

An object of the present invention is to provide a method of manufacturing semiconductor device, which makes it possible to design a circuit pattern that is highly favorable to increase in device packing density, eliminating the need of giving any mask allowance for alignment of the contact window against the one conductivity type region.

Another object of the present invention is to provide a method of manufacturing semiconductor devices in which any deterioration of the junction in the contact regions is effectively prevented.

According to the present invention, there is provided a method of manufacturing a semiconductor device which is characterized by comprising the steps of forming a region of one conductivity type in the semiconductor substrate of the opposite conductivity type or in another region of the opposite conductivity type formed in turn in or on the semiconductor substrate of one conductivity type, covering the surface of the one conductivity type region with an insulating layer, opening a contact window in the insulating layer to expose at least a portion of the surface of the one conductivity type region, depositing a layer of silicon over the insulating layer, introducing an impurity of the one conductivity type from the silicon layer through the contact window into the one conductivity type region, depositing a conductive layer over the silicon layer, defining a pattern of electrode and/or interconnection in the conductive layer, and defining the same pattern in the silicon layer. The silicon layer is favorably of polycrystalline silicon, and is doped with the one conductivity type impurity during its deposition or after its deposition. Its thickness is favorably 300 angstroms or more. The conductive layer may be of a conductive material such as aluminum, molybdenum, or other metal.

Since an impurity of the same conductivity type as the one conductivity type region is introduced from the silicon layer through the contact window into the one conductivity type region, the conductive layer never causes shortcircuiting of the p-n junction of the one conductivity type region even if no alignment allowance is provided with the one conductivity type region.

Moreover, when aluminum is used as the conductive layer, the silicon layer lying under the conductive layer of aluminum serves as a source of silicon aupply to the aluminum layer during heat treatment. There arises, therefore, no dissolution or diffusion of silicon from the contact region into the conductive layer of aluminum and, despite the heat treatment to which the substrate is subjected, there is no impairment of the p-n junction in the substrate, even if the p-n junction is as shallow as 1.8 micron or less. The thickness of the aluminum layer is favorably 1.5 micron or more.

The above and other objects, features and advantages of the present invention will become apparent from the following detailed description when taken in conjunction with the accompanying drawings.

BRIEF DESCRIPTION OF THE DRAWINGS

In the drawings:

FIGS. 1A to 1H are cross-sectional views illustrating the successive steps of the MOS transistor fabrication according to an embodiment of this invention;

FIGS. 1I and 1J are cross sectional views illustrating the alternative process for the steps shown in FIGS. 1G and 1H;

DESCRIPTION OF THE PREFERRED EMBODIMENTS

Figure 2A:
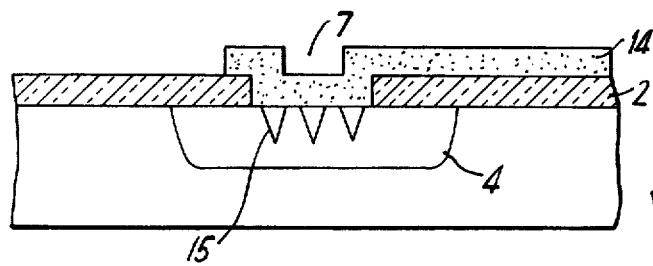
FIGS. 2A and 2B illustrate a conventional contact formation and that of the present invention, respectively.

Description will first be made of an embodiment of the present invention as applied to the fabrication of n-channel MOS transistors with reference to FIGS. 1A to 1J.

First, following the ordinary method of fabrication, as illustrated in FIG. 1A, an oxide layer 2 is deposited on the entire surface of the p-type silicon substrate 1 and such oxide layer is partially removed to define openings therein in a pattern corresponding to the source and drain regions to be formed in the substrate. The source and drain regions having a depth of 0.5 micron are formed, as indicated in FIG. 1A at 3 and 4, respectively, by diffusing phosphorus into the substrate through the openings formed in the oxide layer 2.

Referring next to FIG. 1B, that portion of oxide film 2 which lies on the channel region is removed and a gate oxide film 5 of silicon oxide is formed to a thickness of 5000 angstroms on the exposed surface of the substrate. Though an ordinary aluminum gate MOS technique requires a thin layer of phosphorus glass on the gate oxide film 5 for stabilization thereof, such phosphorus glass layer is not required in the method of this embodiment. The oxide film 5 is partially removed to define contact windows 6 and 7 for the source and drain regions 3 and 4, as shown in FIG. 1C. Then, a polycrystalline silicon layer 8 is deposited on the entire surface of the substrate to a thickness of 3,000 angstroms, as illustrated in FIG. 1D, for example, by the chemical vapor deposition method. Subsequently, the same impurity as that of the source and drain regions 3 and 4, that is, phosphorus in this case, is diffused into the polycrystalline silicon layer 8 to a concentration of about $10^{20}$ $cm^{-3}$, as shown in FIG. 1E. The impurity phosphorus penetrating the polycrystalline silicon layer 8 through the contact windows 6 and 7 further diffuses into the source and drain regions 3 and 4 to form diffused layers 9 and 10 therein. The diffused layers 9 and 10 are apparently of the same conductivity type as the source and drain regions 3 and 4 and exhibit the same electrical characteristics as those of the latter. Instead, the deposited polycrystaline silicon layer 8 may be doped with phosphorus of a concentration of about $10^{20}$ $cm^{-3}$ in advance, followed by diffusion of this doped phosphorus into the source and drain regions by heat treatment at a temperature of 1000° C for 10 minutes. Subsequently, an aluminum layer 11 is deposited over the polycrystalline silicon layer 8, as shown in FIG. 1F. Then, by known photoetching techniques, the aluminum layer 11 is partially removed to define a predetermined conductive pattern of source, gate, and drain electrodes 12, 13, and 14, as shown in FIG. 1G and subsequently, the polycrystalline silicon layer 8 is partially removed by etching by use of the conductive pattern 12, 13 and 14 of aluminum as an etch mask. In this manner, there is obtained in the whole area of the conductive layer a bilaminar structure including a polycrystalline silicon 22, 23 and 24 and an aluminum film 12, 13 and 14, as shown in FIG. 1H, which serves as a source conductor 12–22, a gate electrode 13–23 and a drain conductor 14–24.

Instead of the etching process shown in FIGS. 1G and 1H, the selective oxidation process may be employed for defining the pattern in the layers 11 and 8. Referring to FIGS. 1I and 1J, the undesired portion of the aluminum layer 11 is converted into aluminum oxide 31 to leave the drain and source conductors 14 and 12 and the gate electrode 13 by the known selective anodization process, and the silicon layer 8 is also selectively oxidized to form silicon oxide layer 32 under the aluminum oxide 31.

It is to be noted at this point that the primary advantage of the interconnection technique of the present invention lies in the novel contact structure, which will be described below.

In conventional techniques, only aluminum has been employed as a conductor material and, as illustrated in FIG. 2A, the aluminum conductor 14' is connected with the diffused region 4 directly through the contact window 7 formed in the oxide film 2. In order to obtain a better electrical contact between the aluminum conductor 14' and diffused region 4, the heat treatment, commonly referred to as "alloying", is carried out at a temperature of about 400° to 500° C.

In this alloying step, silicon is diffused or dissolved out from the substrate into the aluminum conductor 14' leaving in the silicon side small pits 15 commonly called "alloy spikes", in which pits aluminum from the conductor intrudes. The depth of alloy spikes increases with alloying time and they may finally break down the characteristics of the p-n junction in the substrate. In the ordinary process, therefore, the depth of impurity diffusion into the substrate cannot be reduced below 1.8 micron and this has precluded any substantial reduction in the size of semiconductor elements.

Figure 2B:
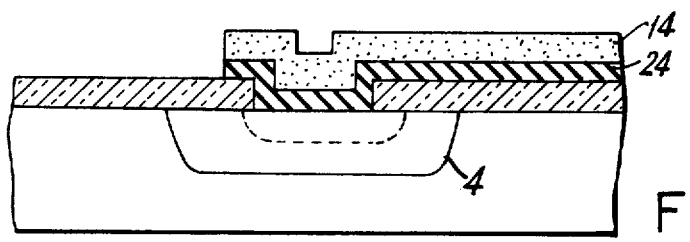

FIG. 2B illustrates a typical example of contact formation embodying the present invention. As observed therein, the conductor is formed in a bilaminar structure including a polycrystalline silicon film 24 and an overlying aluminum film 14 and the contact of such conductor with the diffused region 4 is attained by way of the polycrystalline silicon 24. With this contact formation, there arises again diffusion of silicon into the aluminum film, in the alloying process but in this case the silicon is supplied from the polycrystalline silicon film 24, independently of the diffused region 4 of the substrate and there is no adverse effect whatsoever upon the characteristics of the p-n junction in the substrate.

Prior to the present invention, there have been known a number of techniques designed to overcome the problem of alloy spikes. In one known method, aluminum is employed as a conductor material in the form of a mixture with a prescribed amount of silicon and, in another, a bilaminar conductor structure is formed by vapor deposition, first, of polycrystalling silicon and, then, of pure aluminum. In an alternative method, first aluminum and then polycrystalline silicon are vapor-deposited and additionally aluminum is vapor-deposited so that the polycrystalline silicon deposit is sandwiched between the two alluminum layers. These and other known methods are more or less satisfactory to the purpose of avoiding the alloy spikes, but the method of the present invention is highly advantageous over any previously known techniques particularly on account of its effects exhibited in meeting the problem of contact misalignment, as will be described below.

Figure 3A:
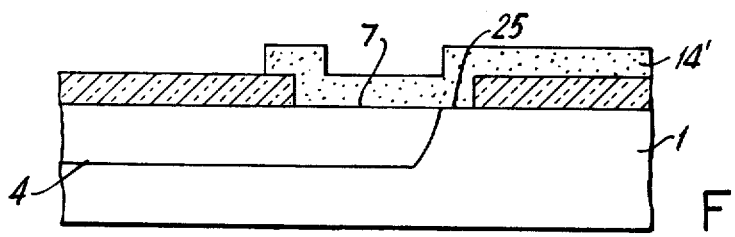
FIG. 3A is a fragmentary cross-sectional view of a conventional contact formation, illustrating the contact window formed in a shifted relation to a region of the substrate.
Figure 3B:
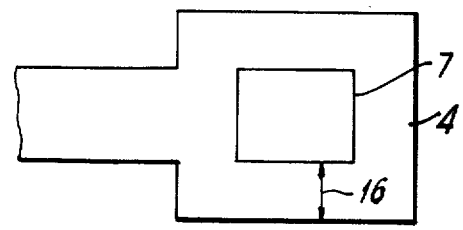
FIG. 3B is a fragmentary plan view showing the alignment allowance conventionally made in the region of the substrate to overcome the situation illustrated in FIG. 3A.
Figure 3C:
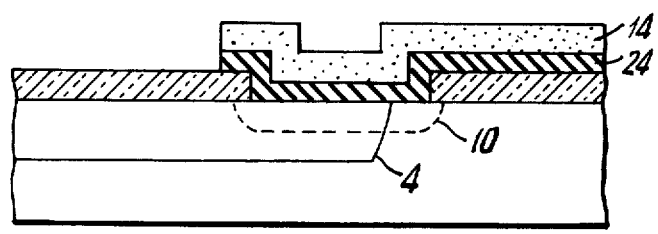
FIGS. 3C and 3D are views similar to FIGS. 3A and 3B, respectively, illustrating a contact formation according to the present invention.
Figure 3D:
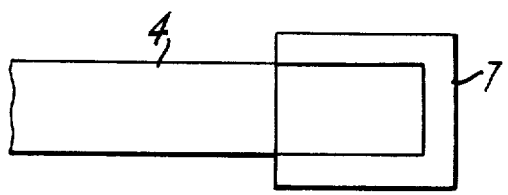

According to any of the known techniques, if the contact window 7 is positioned in overlapping relation to the diffused region 4 of the substrate, as illustrated in FIG. 3A, that portion 25, of the contact which extends beyond the diffused region 4 forms an electrical short between the diffused region and the substrate 1. In order to avoid such short-circuiting, it has been necessary in the prior art methods to provide an appropriate allowance in size of the diffused region 4 relative to the contact window 7, as indicated at 16 in the plan of FIG. 3B, so that the contact window 7 may be formed at all times within the area of diffused region 4 despite any possible misalignment of the photoresist formation. Such allowance 16 has naturally caused more or less increase in the size of semiconductor elements. According to the present invention, an impurity of the same conductivity type as that of the contact region 4 is diffused into the contact region 4 from the polycrystalline silicon layer. Therefore, as illustrated in FIG. 3C, there is formed at all times a diffused layer 10 in that portion of the substrate surface which lies under the contact window in direct contact with the polycrystalline silicon layer. Since the impurity forming the diffused layer 10 is the same in type as that of the contact region 4 previously formed in the substrate, the diffused layer 10 forms an enlarged region of the same conductivity type of the contact region 4 and there arises no shortcircuiting of the p-n junction. It will be readily appreciated, therefore, that according to the present invention there is no need in designing semiconductor elements for laying the contact window 7 within the extent of the contact region 4, as viewed in plan, and the contact window 7 can be extended freely beyond the region 4, thus enabling reduction in area of the region 4, as illustrated in FIG. 3D.

Figure 4:
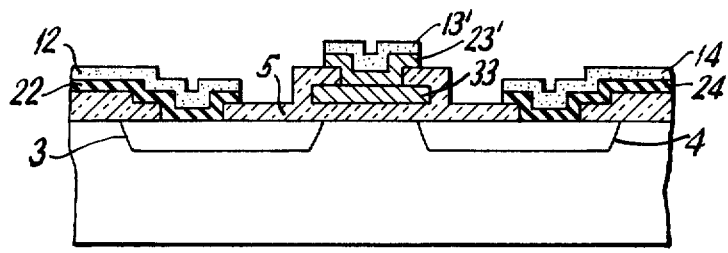
FIG. 4 is a cross-sectional view illustrating a semiconductor device made according to another embodiment of the present invention.

Though an application of the present invention to the fabrication of aluminum gate MOS transistor has been described hereinbefore with reference to FIG. 1 it will be apparent that the principle of the present invention can also be advantageously applied to the fabrication of silicon gate type insulated-gate field effect transistor particularly in connection with the conductive pattern of aluminum. FIG. 4 illustrates the final structure of a silicon gate device obtainable by the method of the present invention. It will be readily understood that in this application all the advantages previously described with reference to FIGS. 2A, 2B and 3A to 3D are again obtainable in connection with the contact formation between the source and drain conductors 12-22 and 14-24 and the associated source and drain regions 3 and 4. To a silicon gate 33 which is formed by the known method, a gate conductor comprised of silicon layer 23' and aluminum layer 13' is connected.

Figure 5:
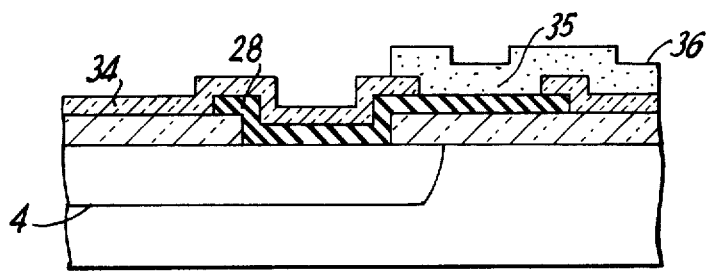
FIG. 5 is a view similar to FIG. 3A, illustrating a conventional form of semiconductor device designed to attain the same objective as of the present invention but involving some critical disadvantages.

It is to be noted at this point that the method of the present invention is not a sole solution of the problem of contact misalignment previously encountered as described with reference to FIG. 3C. In one known method, the conductor pattern includes, as illustrated in FIG. 5, a polycrystalline silicon layer 28 lying in direct contact with the associated region 4 and an aluminum layer 36 contacted with the polycrystalline silicon layer 28 through another contact window 35 formed in an insulating film 34 covering the silicon layer 28. With such conductor formation, a substantially similar result to that of the present invention may be obtainable so far as the contact alignment is concerned. However, in this known method, a greater number of photoresist steps are required, including two additional steps, one for the formation of polycrystalline silicon 28 on the contact region 4 alone and the other for formation of the contact window 35 in the insulating film 34 enabling direct contact between the polycrystalline silicon layer 28 and aluminum layer 36. As is well known in the art, the yield of the process of manufacturing semiconductor devices largely depends upon the number of photoresist steps required and apparently any increase in the number of such steps forms quite a serious disadvantage of the process. According to an important feature of the present invention, the pattern in the polycrystalline silicon layer is defined by using the pattern of aluminum layer thereon as mask means, as described hereinbefore, and, in this regard, the method of the present invention is advantageous over any known methods. As exemplified in FIG. 1, it is possible to obtain a conductive pattern of bilaminar structure including an aluminum layer and a polycrystalline silicon layer without necessitating any additional photoresist step, the polycrystalline silicon film lying between the aluminum film and the semiconductor substrate in the contact region of the bilaminar conductor.

Figure 6:
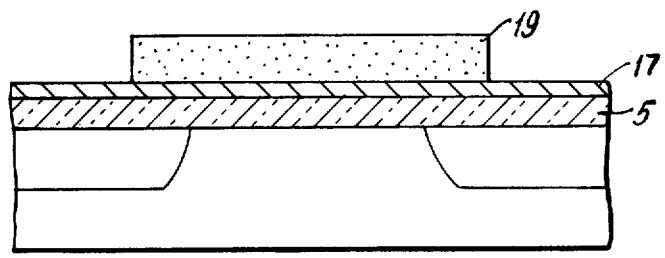
FIG. 6 is a fragmentary cross section of a conventional form of MOS transistor of the type having an aluminum gate electrode.

It is to be noted that the present invention is also applicable to the aluminum gate MOS technique with particular advantages. Referring to FIG. 6, which illustrates, in cross section, a conventional form of aluminum gate electrode on a MOS transistor, reference numeral 17 indicates a thin layer of phosphorus glass formed on the gate oxide film 5 in order to stabilize the electrical characteristics of the gate oxide film 5. The phosphorus glass layer 17 can serve the intended purpose, acting as a getter to capture $Na^+$ and other mobile charges within the oxide film 5 but is itself polarized, giving a reverse effect of rendering the threshold voltage of the MOS transistor unstable. Such gate structure has further disadvantages that the phosphorus glass layer 17 is charged positive and any variation in its thickness results in variation in value of the threshold voltage of the MOS transistor. In view of the above, it is highly desirable that the gate insulator 5 be made stable without necessitating the formation of any phosphorus glass layer such as illustrated in FIG. 6 at 17.

Figure 7:
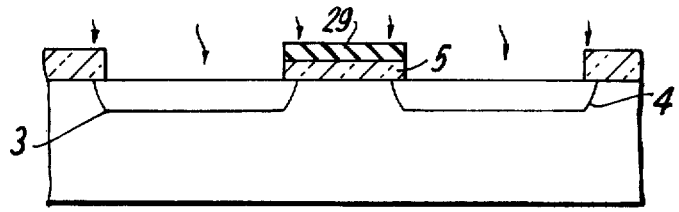
FIG. 7 is a view similar to FIG. 6, illustrating the step of impurity diffusion into the substrate of a MOS transistor of the type having a silicon gate.

On the other hand, according to a well-known silicon gate technique, the gate region including an oxide film 5 and an overlying gate layer 29 of polycrystalline silicon is subjected to the diffusion of an impurity, as illustrated in FIG. 7, when such impurity is diffused into the substrate to form source and drain regions 3 and 4 therein. Particularly, with the case of n-channel MOS transistors, in which phosphorus is employed as an impurity material, it is known that the gate oxide film 5 can be efficiently stabilized in an ideal fashion. That is to say, the oxide film 5 in this case exhibits highly stable electrical properties under the effect of phosphorus atoms penetrating the overlying polycrystalline silicon layer 29 and also in this case there is no formation of any polarizable substance such as to be called phosphorus glass.

Therefore, the insulated-gate field effect transistor of n-channel and of silicon gate type is usable to advantage as the oxide film of such gates can be made stable without use of phosphorus glass, thus giving a threshold voltage much higher in reproducibility and stability than that with aluminum gates, which have necessitated the use of phosphorus glass.

Figure 8A:
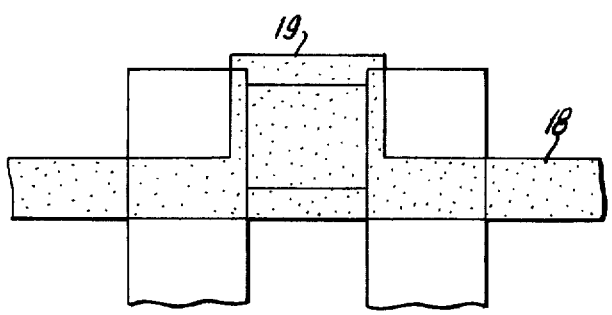
FIG. 8A is a schematic plan view, illustrating a typical form of conventional aluminum gate structure including a conductive pattern of aluminum and an aluminum gate electrode as a part thereof.
Figure 8B:
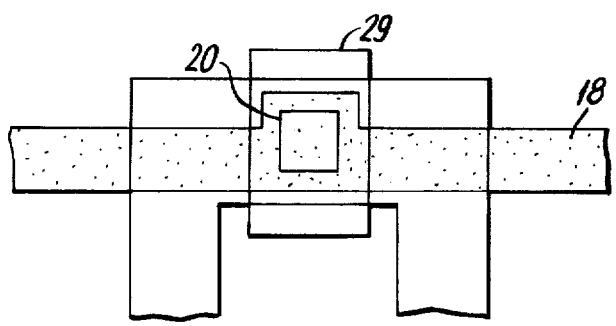
FIG. 8B is a view similar to FIG. 8A, illustrating a typical form of conventional silicon gate structure including a gate electrode of polycrystalline silicon and a conductive pattern of aluminum connected therewith through a contact window.

On the other hand, in aluminum gate techniques, the gate electrode 19 can be formed as part of a gate conductor 18 since, for example, in the illustration of FIG. 8A, the gate conductor 18 and the associated gate electrode 19 are formed of the same conductive metal material, i.e., aluminum, and there is no need for forming any particular contact window in interconnecting the conductor 18 and the gate electrode 19. In silicon gate techniques, however, it is usual that the gate conductor 18 and gate electrode 29, respectively formed of aluminum and polycrystalline silicon, are connected to each other through a contact window 20 formed in an insulating layer, as illustrated in FIG. 8B. Since the number of contact windows strongly governs the production yield of large scale integrated circuits, aluminum gate devices generally excel in production yield.

In case where the interconnection method of the present invention is applied to the aluminum gate technique, the gate insulator is stabilized in the process of fabricating gate electrodes by the step of FIG. 1E on the same principle as of the silicon gate technique and, as illustrated in FIG. 1H, the structure finally obtained in effect forms a silicon gate. It will readily be appreciated, therefore, that, according to the present invention, a novel method of manufacturing semiconductor devices of the type concerned has been realized which is highly advantageous over any prior art method, having incorporated the merits of the silicon gate technique in connection with the threshold voltage and those of the aluminum gate techniques including particular convenience in forming a conductive pattern required.

Although the invention is described with respect to the embodiments of MOS devices in which the contact region of one conductivity type is formed in the substrate of the opposite conductivity type, this invention is also applicable to those other semiconductor devices such as bipolar devices in which the contact region of one conductivity type is formed in another semiconductor region of the opposite conductivity type.

We claim:

1. A method of manufacturing a semi-conductor device comprising the steps of:
    forming a semiconductor region of one conductivity type in a semiconductor substrate;
    forming a contact window in an insulating film covering the surface of said semiconductor substrate to expose at least a portion of the surface of said semiconductor region;
    depositing a layer of silicon over the insulating layer;
    introducing an impurity of said one conductivity type into said semiconductor region through said contact window;
    depositing a conductive layer over the silicon layer;
    defining a pattern in said conductive layer; and thereafter removing a portion of said silicon layer that is not covered by the conductive layer of said pattern.

2. The method of claim 1, in which said semiconductor substrate is silicon, and said conductive layer is aluminum.

3. The method of claim 1, in which said step of introducing an inpurity includes diffusing said impurity from said silicon layer into said semiconductor region.

4. The method of claim 3, in which said step of introducing an impurity further includes diffusing said impurity into said silicon layer from the surface of said silicon layer.

5. The method of claim 1, in which the deposited silicon layer is doped with the impurity of said one conductivity type, and said introducing step includes diffusing doped impurity from said silicon layer into said semiconductor region.

6. The method of claim 1, in which said step of defining a pattern in said conductive layer includes removing undesired portion of said conductive layer.

7. The method of claim 1, in which said step of defining a pattern in said conductive layer includes converting undesired portion of said conductive layer into insulator, and said step of defining a pattern in said silicon layer includes converting undesired portion of said silicon layer into insulator.

8. A method of manufacturing a semiconductor device comprising the steps of
    forming a region of one conductivity type in a semiconductor substrate,
    covering the surface of said semiconductor substrate with an insulating layer,
    forming a contact window for said region in said insulating layer,
    depositing a polycrystalline silicon layer over said insulating layer,
    diffusing an impurity of said one conductivity type into said polycrystalline silicon layer,
    depositing an aluminum layer over said polycrystalline silicon layer,
    defining a pattern in said aluminum layer, and
    defining the same pattern in said polycrystalline silicon layer.

9. A method of manufacturing a semiconductor device comprising the steps of
    forming a region of one conductivity type in a semiconductor substrate,
    covering the surface of said semiconductor substrate with an insulating layer,
    forming a contact window for said region in said insulating layer,
    depositing a silicon layer doped with an impurity of said one conductivity type over said insulating layer,
    diffusing said impurity from said silicon layer into said region through said contact window,
    depositing an aluminum layer over said silicon layer,
    defining a pattern in said aluminum layer, and defining the same pattern in said silicon layer.

10. A method of manufacturing an insulated-gate field-effect semiconductor device comprising the steps of forming a source and a drain regions of one conductivity type in a semiconductor substrate of the opposite conductivity type, covering the surface of said semiconductor substrate with an insulating layer, forming contact windows for said source and drain regions in said insulating layer, depositing a polycrystalline silicon layer over said insulating layer.

introducing an impurity of said one conductivity type from said polycrystalline silicon layer through said contact windows into said source and drain regions, respectively, depositing a conductive layer over said polycrystalline silicon layer, defining a pattern in said conductive layer, and defining the same pattern in said polycrystalline silicon layer.

11. The method of claim 10, further comprising the step of diffusing said impurity into said polycrystalline silicon layer before said introducing step.

12. The method of claim 10, in which said conductive layer is aluminum.

13. The method of claim 12, in which said pattern includes pattern of source and drain electrodes.

* * * * *